(12) United States Patent
Dahle et al.

(10) Patent No.: US 11,967,960 B2
(45) Date of Patent: Apr. 23, 2024

(54) METHODS AND APPARATUS FOR SYNCHRONIZING DATA TRANSFERS ACROSS CLOCK DOMAINS USING HEADS-UP INDICATIONS

(71) Applicant: Advanced Micro Devices, Inc., Santa Clara, CA (US)

(72) Inventors: David M. Dahle, Fort Collins, CO (US); Richard Martin Born, Fort Collins, CO (US); Deepesh John, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 135 days.

(21) Appl. No.: 17/389,749

(22) Filed: Jul. 30, 2021

(65) Prior Publication Data

US 2023/0035110 A1 Feb. 2, 2023

(51) Int. Cl.
*H03L 7/081* (2006.01)
*G06F 5/08* (2006.01)
*H03L 7/087* (2006.01)
*H03L 7/195* (2006.01)

(52) U.S. Cl.
CPC .............. *H03L 7/0814* (2013.01); *G06F 5/08* (2013.01); *H03L 7/087* (2013.01); *H03L 7/195* (2013.01); *G06F 2205/061* (2013.01)

(58) Field of Classification Search
CPC .......... G06F 1/12; G06F 1/324; G06F 13/161; G06F 13/1673; G06F 2205/061; H03L 7/0814; H03L 7/087
See application file for complete search history.

(56) References Cited

U.S. PATENT DOCUMENTS

| | | | | |
|---|---|---|---|---|
| 6,516,362 B1* | 2/2003 | Magro | ...................... | G06F 5/06 713/400 |
| 6,898,726 B1* | 5/2005 | Lee | .......................... | G06F 1/12 375/376 |
| 7,451,337 B1* | 11/2008 | Hewitt | ..................... | G06F 1/10 713/400 |
| 7,966,439 B1 | 6/2011 | Treichler et al. | | |
| 7,966,468 B1* | 6/2011 | Simeral | ..................... | G06F 5/06 713/400 |

(Continued)

OTHER PUBLICATIONS

1 International Search Report and Written Opinion, PCT/US2022/038243, dated Nov. 2, 2022, 9 pages.

*Primary Examiner* — Raymond N Phan (57) ABSTRACT

Methods and apparatus for synchronizing data transfers across clock domains for using heads-up indications. An integrated circuit includes a first-in first-out buffer (FIFO); a memory controller configured to operate in a first clock domain and coupled to the FIFO, the first clock domain associated with a first clock signal; a data fabric configured to operate in a second clock domain and coupled to the FIFO, the second clock domain associated with a second clock signal, a second frequency of the second clock signal being different from a first frequency of the first clock signal; and a controller coupled to the FIFO. In some instances, the controller determines a phase relationship between the first clock signal and the second clock signal; monitors one or more first clock edges of the first clock signal and one or more second clock edges of the second clock signal; and sends a first heads-up signal to the memory controller.

20 Claims, 5 Drawing Sheets

(56) References Cited

U.S. PATENT DOCUMENTS

| | | | |
|---|---|---|---|
| 9,367,286 B2* | 6/2016 | Rozario | G06F 15/00 |
| 2013/0170591 A1* | 7/2013 | Su | H04L 7/02 |
| | | | 375/371 |
| 2013/0315014 A1* | 11/2013 | Dearth | G11C 7/22 |
| | | | 365/193 |
| 2018/0017988 A1* | 1/2018 | Kommrusch | G06F 13/4059 |
| 2019/0179777 A1* | 6/2019 | Born | G06F 13/161 |

* cited by examiner

METHODS AND APPARATUS FOR SYNCHRONIZING DATA TRANSFERS ACROSS CLOCK DOMAINS USING HEADS-UP INDICATIONS

BACKGROUND

A processor may use clock signals with different frequencies for different portions of the processor, where a processor portion is referred to as a clock domain. By using different clock domains, the processor can operate the different portions at different frequencies, and also operate the different portions relatively independent with respect to timing of logic operations. However, when data is communicated across clock domains of the processor, meta-stability errors may arise. These errors can be addressed by including a meta-stability circuit, such as flip-flop circuits, between the clock domains to effectuate the data transfer. However, such meta-stability circuits can add latency, as well as require extra circuitry (e.g., extra buffer entries) to address control signal delays.

BRIEF DESCRIPTION OF THE DRAWINGS

The embodiments will be more readily understood in view of the following description when accompanied by the below figures and wherein like reference numerals represent like elements, wherein.

DETAILED DESCRIPTION OF EMBODIMENTS

The present disclosure generally relates to, among other things, methods, systems, and apparatus for synchronizing data transfers between memories and data fabrics operating in different clock domains, for example, using indications prior to the data transfers with an offset associated with the latency of memories and data fabrics. The systems and methods can reduce the latency of accessing memories and/or data fabrics by processors. In many circumstances, efficient transfer of data packets may require an early indication of when the data is going to arrive. Generation of these early indications of the data packet are particularly difficult when this data needs to cross a clock domain boundary without introducing additional latency. In some implementations, a processor includes a first-in-first-out buffer (FIFO) having multiple entries to store data transferred between a memory and a data fabric operating in different clock domains. In some examples, clock signals of the different clock domains are generated using a phase-locked loop (PLL) having multiple phases. In certain examples, clock signals of each of the different clock domains are generated by a respective digital frequency synthesis circuit (DFS) coupled to the PLL. In some examples, two or more DFSs are coupled to a single PLL to generate clock signals with different frequencies, while the phase relationship between the clock signals of different frequency is known or controllable.

In some implementations, a controller receives the memory and data fabric's read/write heads-up cycle information associated with FIFO's read/write operation and uses the heads-up cycle information to generate heads-up signals, also refer to as heads-up indications, to ensure low latency for data transfers between the memory and data fabric. As used herein, heads-up signals (i.e., heads-up indications) refer to indications prior to the data transfers with an offset associated with the latency of memories and data fabrics. In certain implementations, the clock signals are monitored, such that when one of the clock domain frequency is changed, the heads-up signals are adjusted to ensure data transfer performance.

In certain implementations, an integrated circuit includes a first-in first-out buffer (FIFO); a memory controller configured to operate in a first clock domain and coupled to the FIFO, the first clock domain associated with a first clock signal; a data fabric configured to operate in a second clock domain and coupled to the FIFO, the second clock domain associated with a second clock signal, a second frequency of the second clock signal being different from a first frequency of the first clock signal; and a controller coupled to the FIFO. In some instances, the controller determines a phase relationship between the first clock signal and the second clock signal; monitors one or more first clock edges of the first clock signal and one or more second clock edges of the second clock signal; generates a first offset based on the phase relationship, the one or more first clock edges, and the one or more second clock edges; and sends a first heads-up signal based upon the first offset to the memory controller.

In some examples, the controller is coupled to a phase-locked loop (PLL) to generate the first clock signal, where the PLL is configured to generate a plurality of clock phases, and wherein the controller is coupled to the PLL to generate the second clock signal. In certain examples, a first digital frequency synthesis (DFS) is configured to use a first set of clock phases to generate the first clock signal, where each of the first set of clock phases is one of the plurality of clock phases generated by the PLL. In some variations, a second DFS is configured to use a second set of clock phases to generate the second clock signals. In certain variations, each of the second set of clock phases is one of the plurality of clock phases generated by the PLL.

In certain examples, the controller generates a first counter corresponding to the first offset, where the first set of clock phases includes a first phase number of clock phases; wherein the first counter is associated with the first phase number. In some instances, the controller receives a first heads-up cycle number associated with a memory coupled to the memory controller and sends a first command signal based on the first heads-up signal and the first heads-up cycle number to the FIFO. In certain instances, the controller receives a second heads-up cycle number associated with the memory, where the first offset is associated with a memory write operation and the second offset is associated with a memory read operation.

In some examples, the controller receives a third heads-up cycle number associated with the data fabric and a fourth heads-up cycle number associated with the data fabric. In some variations, the controller sends a second heads-up signal based at least in part upon the phase relationship to the data fabric; and sends a second command signal based on the second heads-up signal and the third heads-up cycle number to the FIFO, where the third offset is associated with a data fabric write operation and the fourth offset is associated with a data fabric read operation. In certain variations, the controller monitors a rising edge of each clock edge of the one or more first clock edges for the first clock domain.

In some implementations, a system includes a first-in first-out buffer (FIFO); a memory configured to operate in a first clock domain and coupled to the FIFO, the first clock domain associated with a first clock signal; a data fabric configured to operate in a second clock domain and coupled to the FIFO, the second clock domain associated with a second clock signal, a second frequency of the second clock signal being different from a first frequency of the first clock signal; and a controller coupled to the FIFO. In some instances, the controller determines a phase relationship between the first clock signal and the second clock signal; monitors one or more first clock edges of the first clock signal and one or more second clock edges of the second clock signal; generates a first offset based on the phase relationship, the one or more first clock edges, and the one or more second clock edges; and generates a first heads-up signal based upon the first offset to a memory controller coupled to the memory.

In some examples, the controller is coupled to a phase-locked loop (PLL) to generate the first clock signal, wherein the PLL is configured to generate a plurality of clock phases, and wherein the controller is coupled to the PLL to generate the second clock signal. In certain examples, a first digital frequency synthesis (DFS) uses a first set of clock phases to generate the first clock signal, where each of the first set of clock phases is one of the plurality of clock phases generated by the PLL. In some examples, a second DFS uses a second set of clock phases to generate the second clock signal, wherein each of the second set of clock phases is one of the plurality of clock phases generated by the PLL.

In certain examples, the controller generates a first counter corresponding to the first offset, where the first set of clock phases includes a first phase number of clock phases and the first counter is associated with the first phase number. In some variations, the controller receives a first heads-up cycle number associated with a memory coupled to the memory controller and sends a first command signal based on the first heads-up signal and the first heads-up cycle number to the FIFO. In certain variations, the controller receives a second heads-up cycle number associated with the memory, where the first offset is associated with a memory write operation and the second offset is associated with a memory read operation.

In some examples, the controller receives a third heads-up cycle number associated with the data fabric and a fourth heads-up cycle number associated with the data fabric; sends a second heads-up signal based at least in part upon the phase relationship to the data fabric; and sends a second command signal based on the second heads-up signal and the third heads-up cycle number to the FIFO. In some instances, the third offset is associated with a data fabric write operation, and the fourth offset is associated with a data fabric read operation.

In certain implementations, a method implemented by a controller and includes determining a phase relationship between a first clock signal and a second clock signal, a second frequency of the second clock signal being different from a first frequency of the first clock signal; monitoring one or more first clock edges of the first clock signal and one or more second clock edges of the second clock signal; and receiving a first heads-up cycle number associated with an operation of a memory device to a first-in first-out buffer (FIFO). In some examples, the method includes determining a first offset based on the phase relationship, the one or more first clock edges, and the one or more second clock edges, and the first heads-up cycle number; and sending a first heads-up signal based upon the first offset to the memory device.

In certain examples, the method includes generating the first clock signal using a first set of clock phases generated by a phase-locked loop (PLL); and generating the second clock signal using a second set of clock phases generated by the PLL. In some instances, the method includes generating a first counter associated with the first clock signal, where the first offset is associated with the first counter. In certain instances, where the first set of clock phases includes a first phase number of clock phases. In some variations, the first counter is associated with the first phase number.

In some examples, the method includes determining a second offset based at least in part upon the phase relationship; and generating a second heads-up signal based upon the second offset. In certain examples, the first memory device is a memory, and the second memory device is a data fabric.

Figure 1:
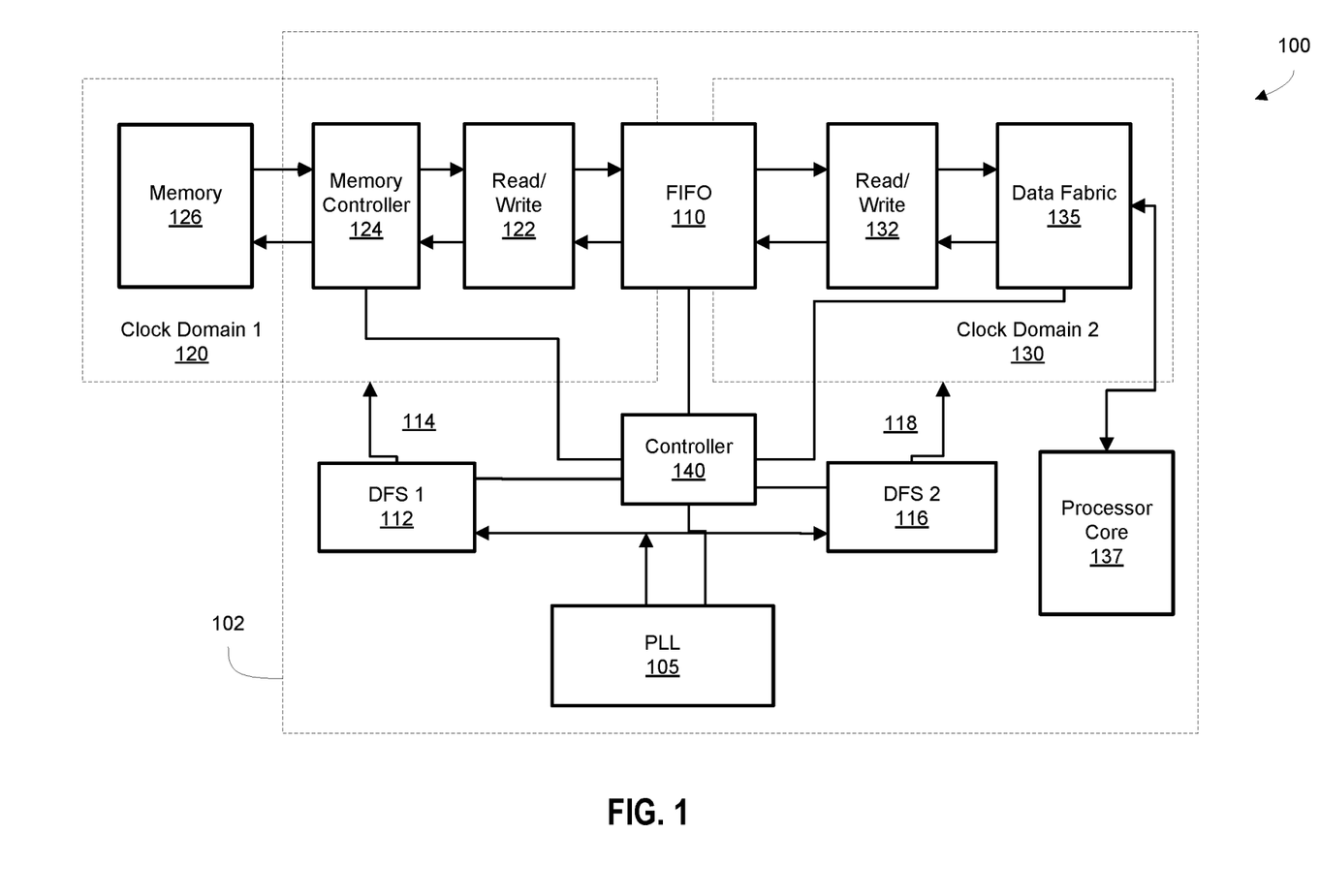
FIG. 1 is a schematic block diagram illustrating a computing system for synchronizing data transfers across two clock domains in accordance with one example set forth in the disclosure.

FIG. 1 is a schematic block diagram illustrating a computing system 100 for synchronizing data transfers across two clock domains in accordance with one example set forth in the disclosure. In some implementations, the computing system 100 is implemented by any type of computing device suitable for implementing aspects of embodiments of the disclosed subject matter. Examples of computing devices include but are not limited to laptops, desktops, tablet computers, hand-held devices, display devices, media players, televisions, game consoles, printers, servers, cloud computing platforms, integrated circuits and the like, all of which are contemplated within the scope of FIG. 1, with reference to various components of the computing system 100.

In some examples, the computing system 100 includes a PLL 105, a FIFO 110, a first DFS 112, a second DFS 116, components running in a first clock domain 120, components running in a second clock domain 130, a processor core 137, and a controller 140. In some instances, the computing system 100 includes a read/write module 122, a memory controller 124, and a memory (e.g., a double data rate dynamic random-access memory (DDR DRAM)) 126 operating in the first clock domain 120. In certain instances, the computing system 100 includes a read/write module 132 and a data fabric 135 operating in the second clock domain 130. In some implementations, a part of or all of the components of the computing system 100 are combined into a single integrated chip (IC). In some implementations, some components in the processor 102 are combined into a single IC, including the PLL 105, the FIFO 110, the first DFS 112, the second DFS 116, the read/write module 122, the memory controller 124, the read/write module 132, the data fabric 135, the processor core 137, and the controller 140. In some implementations, the memory 126 is implemented on a different IC than the IC of the memory controller 124. While FIG. 1 depicts data transfers between the memory 126 and the data fabric 135 through the FIFO 110, other data transfers, such as data transfers between two data fabrics and data transfers between two memories, can use the same FIFO 110 architecture with the PLL 105 and DFSes 112 and 116.

The PLL 105 is an oscillator circuit for generating clock signals that are phase locked to stable oscillating signals provided by a clock source (not shown), such as a reference crystal. In some embodiments, the PLL 105 supplies multiple clock signals that have different phases to support generation of clock signals at different frequencies by combining selected ones of the multiple clock signals. In one example, the PLL 105 supplies eight clock signals that are each 45 degrees shifted in phase from one of the other eight signals. In such example, each clock signal of the eight clock signals is shifted by one-eighth (⅛) of clock cycles from one of the other clock signals. In the example illustrated in FIG. 2A, a PLL can generate 8 eight clock signals 205A, 210A, 215A, 220A, 225A, 230A, 235A, 240A, each also referred to as a PLL clock phase and having a known phase relationship between one another, and collectively referred to as PLL clock signals 200A. In one example, the PLL 105 supplies four clock signals that are each 90-degree shifted in phase from one of the other clock signals.

In some implementations, the first DFS 112 generates a first clock signal 114 by combining a first set of PLL clock phases. In certain implementations, the second DFS 116 generates a second clock signal 118 by combining a second set of selected clock signals of PLL 105. The first set of PLL clock phases includes a first phase number (e.g., 4, 8, 16, etc.) of PLL clock phases. The second set of PLL clock phases includes a second phase number (e.g., 4, 8, 16, etc.) of PLL clock phases. FIG. 2B depicts an illustrative wave diagram of two clock domains, in accordance with one example of the present disclosure. In the example depicted in FIG. 2B, a first clock domain 210B is operating with the clock signal 211B combining eight (8) PLL clock phases and the second clock domain 220B is operating with the clock signal 221B combining sixteen (16) PLL clock phases.

Referring back to FIG. 1, the controller 140 is coupled to the PLL 105, the first DFS 112, and the second DFS 116 to control the generation of the clock signals 114 and 118. In some examples, the controller 140 includes a system management unit (SMU), which controls the operation of one module or one portion of a processor. In certain implementations, the controller 140 is coupled to the FIFO 110 to control the operations of FIFO 110. In some examples, the controller 140 is coupled to the memory controller 124 and the data fabric 135 to receive operation information, control respective operations and provide notices and other information.

In some implementations, the controller 140 tracks clock edges in both clock domains 120 and 130 using an integer counter for each clock domain representing the elapsed number of DFS phases. In some variations, the clock signals 114 and 118 have a known relationship with each other with respect to clock cycles. In certain variations, the clock signals 114 and 118 are restarted at a known timing relationship with each other after a clock gap. As used herein, a clock gap refers to a period of time having no clock signals. In one example, a rising edge of the clock signal 114 occurs at a same time as a rising edge of the clock signal 118. In one example, based upon the controller 140's signals, a rising edge of the clock signal 114 occurs at a same time as a rising edge of the clock signal 118 after a clock gap. In one example, a falling edge of the clock signal 114 occurs at a same time as a falling edge of the clock signal 118. In one example, a rising edge of the clock signal 114 is at a known phase shift (e.g., 45-degree phase shift) from a rising edge of the clock signal 118. As used herein, a phase shift refers to a timing difference between two clock signals divided by a duration of a clock cycle of the primary clock signal (e.g., clock signal 205A in FIG. 2A), expressed in degrees (e.g., multiplied by 360 degree).

In some examples, each clock domain 120, 130 has a counter (not shown) that is adjusted by the number of PLL clock phases (e.g., 4, 8, 16, etc.) used to construct each clock domain. In some variations, tracking logic, implemented by software, hardware, or a combination thereof, in the controller 140 compares the two counters for the two clock domains 120 and 130 and determines when to schedule a transfer through the FIFO 110. In certain variations, both counters run in the faster clock domain and the tracking logic modulates transfers to account for the rate of the slower clock. In some examples, the controller 140 generates one or more heads-up signals (not shown) for the faster clock domain based on the counter for the faster clock domain, where the counter for the faster clock domain is adjusted when enough cycles in the fast clock domain have elapsed to move past the next edge of the slower clock. In certain examples, the controller simply performs a transfer every cycle in the slower clock domain.

Additionally, memory and data fabric have long latencies to move data and overall performance can be improved by knowing multiple cycles in advance when a transfer through the FIFO 110 is scheduled by the controller 140. Consequently, a data transfer can be started with appropriate number of cycles in advance with the knowledge than the resulting data will have a transfer window through the FIFO at the proper time. In some examples, the controller 140 generates one or more heads-up signals (not shown) for transfer indications. In certain examples, the controller 140 generates a read heads-up signal to read data from the FIFO 110 and a write heads-up signal to write data to the FIFO 110.

In some examples, the controller 140 generates a memory read heads-up signal for a memory read operation (i.e., memory read from FIFO) through the read/write module 122 and a memory write heads-up signal for a memory write operation (i.e., memory write to FIFO) through the read/write module 122. In some examples, the controller 140 generates a data fabric read heads-up signal for a data fabric read operation (i.e., data fabric read from FIFO) through the read/write module 132 and a data fabric write heads-up signal for a data fabric write operation (i.e., data fabric write to FIFO) through the read/write module 132. In some variations, the controller 140 generates a heads-up signal based on a respective offset. In certain variations, the controller 140 generates a heads-up signal based on a respective offset applied to a respective counter.

In some examples, an offset is related to the phase number of clock phases used to construct the corresponding clock signal. In certain examples, an offset is proportional to the phase number of clock phases used to construct the corresponding clock signal. In some examples, the offset is proportional to the number of heads-up cycles required for a respective read/write operation. In one example, the offset is proportional to the number of heads-up cycles multiplied by the phase number of clock phases used to construct the corresponding clock signal.

In some examples, the controller 140 receives a memory read heads-up cycle number for the memory read operation (i.e., memory read from FIFO) of the memory 126 coupled to the memory controller 124, determines a first offset based at least in part on the memory read heads-up cycle number, and generates and sends a memory read heads-up signal based upon the first offset to the memory controller 124. In certain examples, the controller 140 receives a memory write heads-up cycle number of the memory write operation (i.e., memory write to FIFO) of the memory 126 coupled to the memory controller 124, determines a second offset based at least in part on the memory write heads-up cycle number, and generates and sends a memory write heads-up signal based upon the second offset to the memory controller 124.

In some examples, the controller 140 receives a data fabric read heads-up cycle number of the data fabric read operation (i.e., data fabric read from FIFO) of the data fabric 135, determines a third offset based at least in part on the data fabric read heads-up cycle number, and generates and sends a data fabric read heads-up signal based upon the third offset to the data fabric 135. In certain examples, the controller 140 receives a data fabric write heads-up cycle number of the data fabric write operation (i.e., data fabric write to FIFO) of the data fabric 135, determines a fourth offset based at least in part on the data fabric write heads-up cycle number, and generates and sends a data fabric write heads-up signal based upon the fourth offset to the data fabric 135.

In some implementations, the controller 140 determines one or more offsets and the counter during a clock gap. In certain implementations, the controller 140 sends a heads-up signal, also referred to as heads-up indication to provide notice to the memory controller 124 or the data fabric 135 with a follow-up command signal to the FIFO 110 to perform the read or write operation. In some variations, the FIFO 110 performs the requested read or write operation to the memory 126 through the read/write module 122 and the memory controller 124. In certain variations, the FIFO 110 performs the requested read or write operation to the data fabric 135 as requested by the read/write module 132.

Figure 2A:
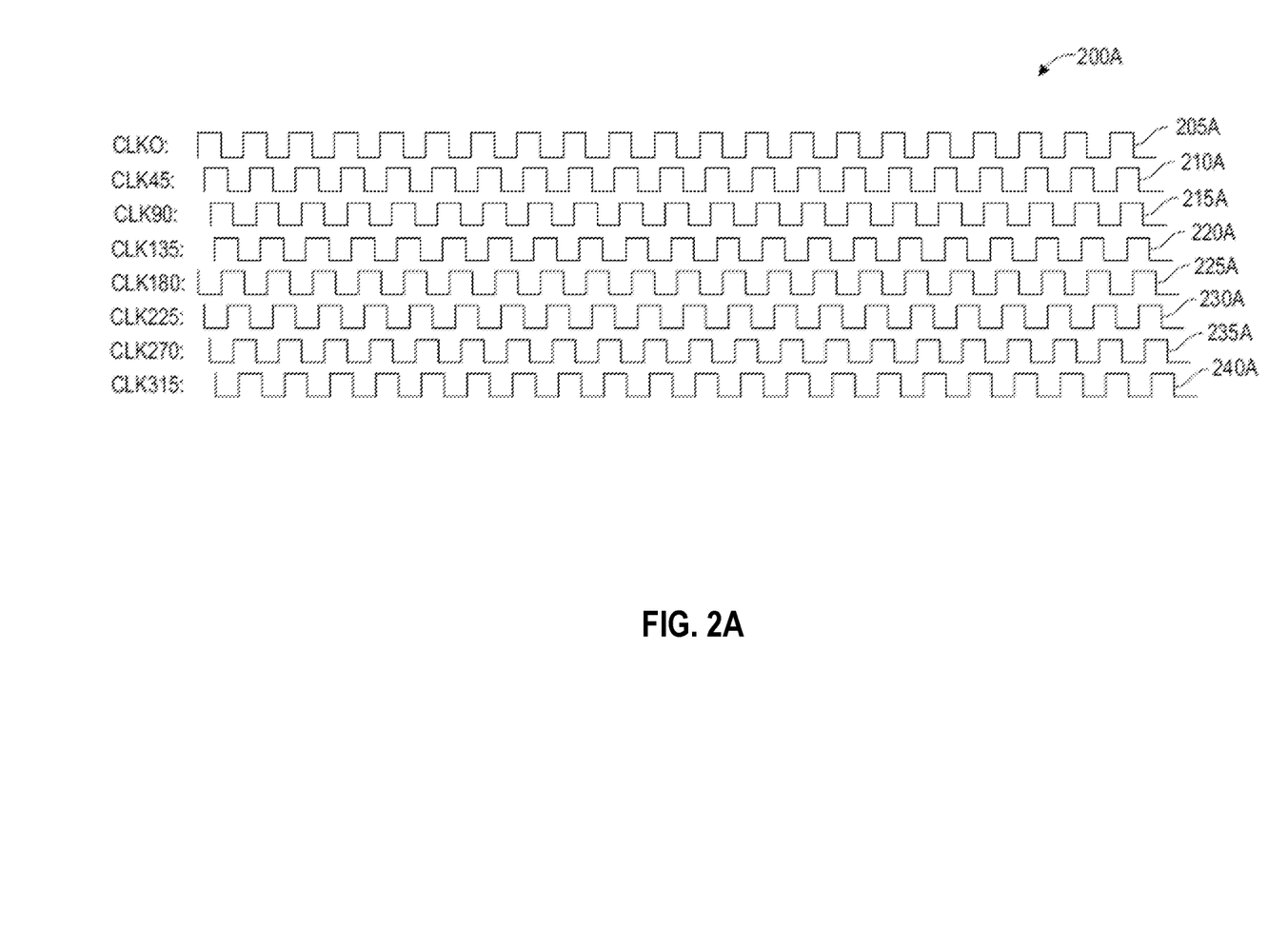
FIG. 2A depicts an illustrative wave diagram of clock signals generated by a phase-locked loop (PLL)
Figure 2B:
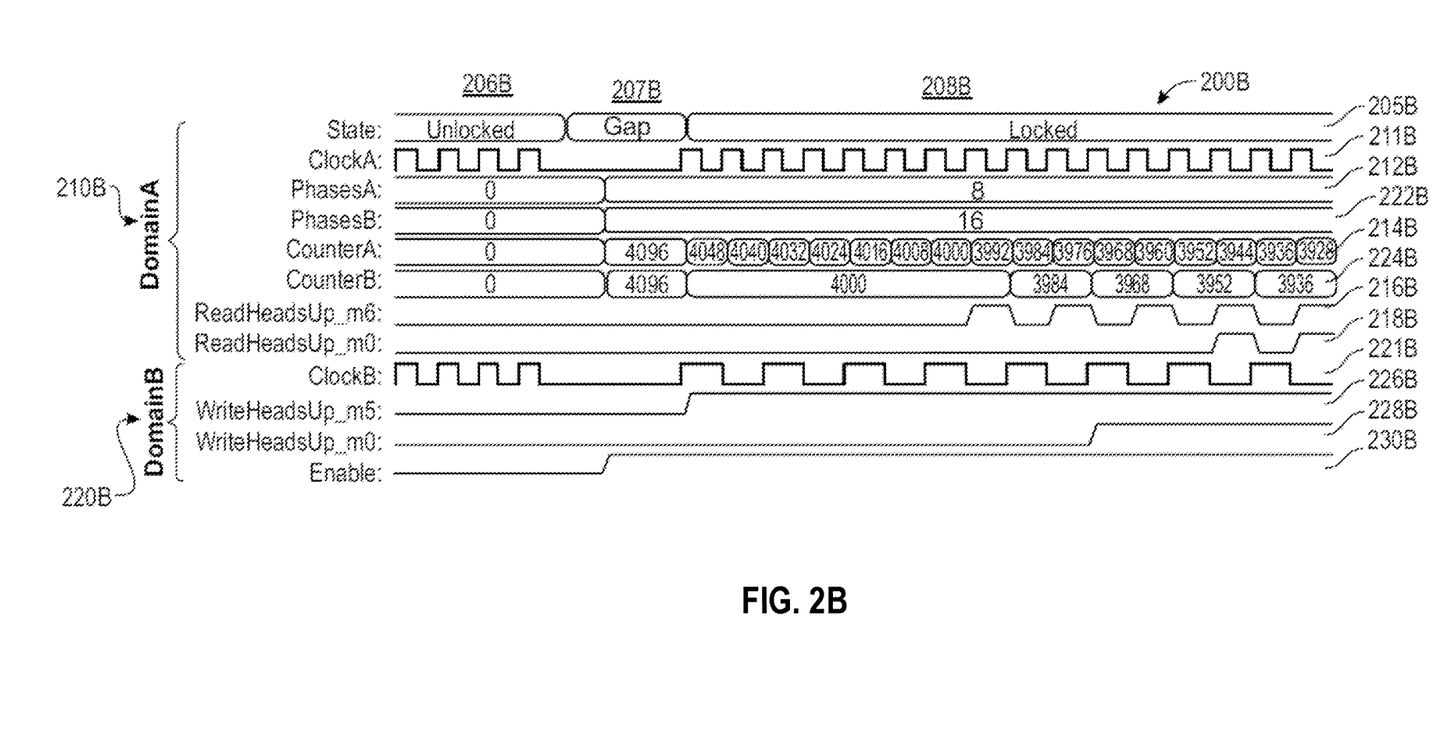
FIG. 2B depicts an illustrative wave diagram of two clock domains, in accordance with one example of the present disclosure

FIG. 2A depicts an illustrative wave diagram of clock signals 200A generated by a PLL, for example, with a multiple, evenly distributed clock phase outputs. As illustrated, the clock signals 200A includes eight clock signals 205A, 210A, 215A, 220A, 225A, 230A, 235A, and 240A, where the clock signal 205A is referred to as the primary clock signal and each other clock signal has a phase shift from the primary clock signal 205A. For example, the clock signal 210A has a 45-degree phase shift from the primary clock signal 205A; the clock signal 215A has a 90-degree phase shift from the primary clock signal 205A; the clock signal 220A has a 135-degree phase shift from the primary clock signal 205A; the clock signal 225A has a 180-degree phase shift from the primary clock signal 205A; the clock signal 230A has a 225-degree phase shift from the primary clock signal 205A; the clock signal 235A has a 270-degree phase shift from the primary clock signal 205A; and the clock signal 240A has a 315-degree phase shift from the primary clock signal 205A.

FIG. 2B depicts an illustrative wave diagram 200B of two clock domains, in accordance with one example of the present disclosure. The clock domains include the clock domain 210B operating with the clock signal 211B and the clock domain 220B operating with the clock signal 221B. In one example, the clock signal 211B is generated using a first set of clock signals 200A illustrated in FIG. 2A and the clock signal 221B is generated using a second set of clock signals 200A illustrated in FIG. 2A. Using this process, the edges of the clock signals 211B and/or 221B align to one of the clock signals (205A-240A) of the PLL, or referred to as phases outputs of the PLL. In the example illustrated, the phase information 212B and 222B provides the phase information for a respective clock domain, where the phase information provides the number of phases used to construct a clock signal. For example, the clock domain 210B has a phase of 8 and the clock domain 220B has a phase of 16, such that the frequency of the clock signal 211B is twice of the frequency of the clock signal 221B. In one example, clock domain 210B is for a memory (e.g., the memory 126 in FIG. 1) and the clock domain 220B is for a data fabric (e.g., the data fabric 135 in FIG. 1).

In certain variations, the enable signal 230B allows a start of the low latency mode. In some implementations, to track clock edges, each clock domain needs the respective clock signal to start at a defined phase alignment. In some variations, each clock domain includes various clock states 205B. In one example, the clock states 205B include an unlocked state 206B, a gap state 207B, and a locked state 208B. During the gap state 207B, the target frequencies of both clock domains 210B (DomainA) and 220B (DomainB) are set, with the number of respective phases (e.g., 8, 16) 212B (PhaseA) and 222B (PhaseB).

In certain variations, the data transfer synchronization system or controller uses counters 214B and 224B running in the clock domain 210B to track clock edges in respective clock domains 210B and 220B. In some variations, once the clock signals of two clock domains start from a known phase relationship, two counters in each domain can be used to track clock edges of both clock domains. For example, as illustrated, clock domain 210B includes the counter 214B for the clock domain 210B and the counter 224B for the clock domain 220B.

In some examples, a write to the FIFO in the clock domain 220B and a read from the FIFO in the clock domain 210B form a first communication channel. In certain examples, a write to the FIFO in the clock domain 210B and a read from the FIFO in the clock domain 220B form a second communication channel. In some implementations, if the number of read heads-up cycles (e.g., 6) is different from the number of write heads-up cycles (e.g., 7) in a first clock domain, the first clock domain includes four (4) counters to track the first and the second communication channels in the first clock domain. In certain implementations, a second clock domain includes four (4) other counters to track the first and the second communication channels in the second clock domain.

In some examples, the counters 214B and 224B are set to respective initial values (e.g., 4048, 4000) at the first cycle after the start of the low latency mode (e.g., the enable signal 230B at logic high). In certain examples, the counters' initial values are associated with the number of phases constructing the clock domain and the larger of the number of read heads-up cycles and the number of write heads-up cycles of the other clock domain for a communication channel. In one example, the counters 214B and 224B are decremented from its respective initial value by the number of phases used to construct that clock domain, one for a respective clock signal, to track respective clock edges.

In one example, the initial value of the counter 214B used to track clock edges of the clock domain 210B is adjusted by equation (1) below:

$$\text{Max(ReadHeadsUp of DomainA, WriteHeadsUp of DomainB)} * \text{PhasesA} \quad (1),$$

where ReadHeadsUp is the number of read heads-up cycles and WriteHeadsUp is the number of write heads-up cycles.

In one example, the initial value of the counter 224B used to track clock edges of the clock domain 220B is adjusted by equation (3) below:

$$\text{Max(ReadHeadsUp of DomainA, WriteHeadsUp of DomainB)} * \text{PhasesB} \quad (2)$$

In one example, the initial value of a counter (not shown) used to track clock edges of the clock domain 210B for a communication channel of writing to FIFO in clock domain 210B and reading from FIFO in clock domain 220B is adjusted by equation (3) below:

$$\text{Max(WriteHeadsUp of DomainA, ReadHeadsUp of DomainB)} * \text{PhasesA} \quad (3)$$

In one example, the initial value of the counter (not shown) used to track clock edges of the clock domain 220B for the communication channel of writing to FIFO in clock domain 210B and reading from FIFO in clock domain 220B is adjusted by equation (4) below:

$$\text{Max(WriteHeadsUp of DomainA, ReadHeadsUp of DomainB)} * \text{PhasesB} \quad (4)$$

In the illustrated example, the controller uses the larger of the read heads-up cycles and write heads-up cycles, which is 6, the counters 214B and 224B are 12-bit values so the initial value at the first cycle for the counter 214B is 4096−6*8=4048 and the initial value for the counter 224B is 4096−6*16=4000. In the example, the counter 214B (is decremented by the phase count of the first clock signal 211B (e.g., 8) from the initial value and the counter 224B is decremented by the phase count of the second clock signal 221B (e.g., 16) from the initial value. In some examples, the heads-up signal(s) for the slower clock domain starts from the initial cycle. In certain examples, the heads-up signal(s) for the faster clock domain at logic high at a time determining by a comparison of the counter for the faster clock domain and the counter for the slower clock domain. In some examples, the heads-up signal(s) of the faster clock domain is at logic high when the counter for the faster clock domain is smaller or equal to the counter for the slower clock domain and the counter for the slower clock domain is greater than the next counter value of the counter for the slower clock domain. In certain examples, the heads-up signal(s) of the faster clock domain is at logic high when the counter for the faster clock domain and the counter for the slower clock domain matched. In the illustrated example, the read heads-up signal is generated when both counters 214B and 224B are at 4000.

In some implementations, the command signals 218B and 228B are at logic high after the respective heads-up cycles of the respective heads-up signals. In the illustrated example, the command signal 218B is at 6 clock 211B cycles after the heads-up signal 216B and the command signal 228B is at 5 clock 221B cycles after the heads-up signal 226B. In some variations, the read command signal 218B enables a read from the FIFO and the write command signal 228B enables a write to the FIFO. In one example, the write command signal 228B enables a write of "read request" to the FIFO and the read command signal 218B follows.

In certain implementations, after the gap state 207B, after the clock signals 211B and 221B restart from a known phase alignment, counters 214B and 224B for the respective clock domains 210B and 220B track edge locations that are used to determine the optimal times to transfer data. In some variations, the counters 214B and 224B are operated in the faster clock domain (e.g., clock domain 210B). In certain variations, the slower clock domain (e.g., the clock domain 220B) performs a transfer every cycle and the faster clock domain selects a clock edge to start a transfer.

In some implementations, the clocking system may receive or determine, for example, via software or hardware interface, via reading a configuration setting, or via reading from data repository, a heads-up cycle for a respective read and write. By way of examples, the heads-up cycles for a memory and a data fabric read and write operations are respectfully 6, 17, 9, and 5 cycles. In certain implementations, the controller (e.g., the controller 140 in FIG. 1) coupled to the FIFO generates heads-up signals 216B and 226B using the heads-up cycles. In some variations, the heads-up cycles account for various overheads.

In some variations, both counters 214B and 224B run in the fast clock domain, as the slow domain performs a transfer every cycle and the fast side selects the proper edges to use. In certain variations, using the countering approach, the clocking system can synchronize data transfers independent of clock frequencies.

Figure 3:
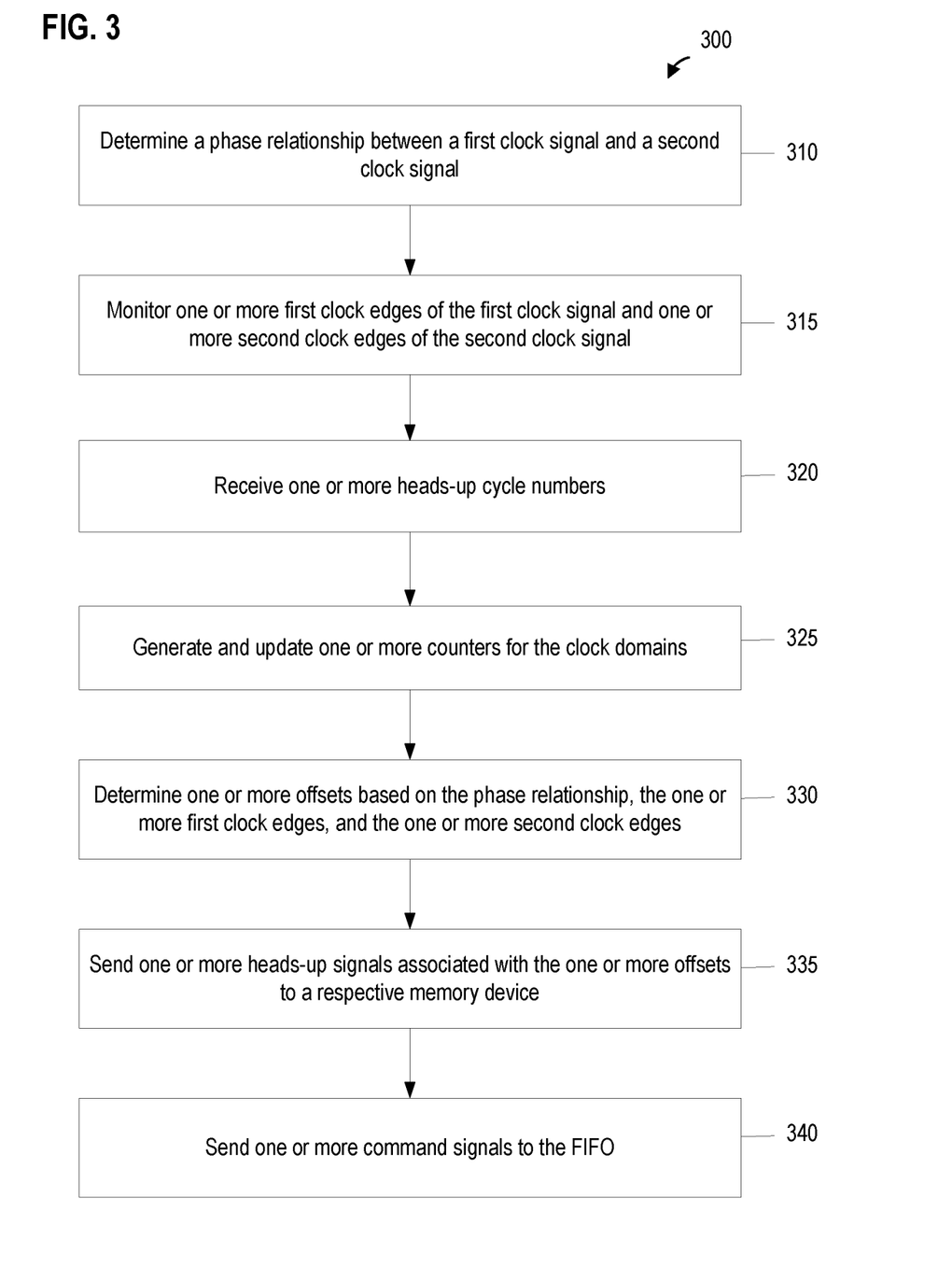
FIG. 3 is a flowchart illustrating one example of a method for synchronizing data transfers across two clock domains in accordance with one example set forth in the disclosure.

FIG. 3 is a flowchart illustrating one example of a method 300 for synchronizing data transfers across two clock domains in accordance with one example set forth in the disclosure. Aspects of embodiments of the method 300 are performed, for example, a controller (e.g., the controller 140 in FIG. 1). In some implementations, one or more steps of method 300 are optional and/or modified by one or more steps of other embodiments described herein. In some implementations, one or more steps of other embodiments described herein are added to the method 300. In certain implementations, the order of one or more steps of method 300 may be changed. In some examples, the two clock domains includes a first clock domain associated with a first clock signal and a second clock domain associated with a second clock signal, where the frequency of the second clock signal is different from the frequency of the first clock signal. In certain examples, the frequency of the second clock signal is proportional to the frequency of the first clock signal.

In some implementations, the controller is coupled to a phase-locked loop (PLL) to generate the first clock signal, where the PLL is configured to generate a plurality of clock phases. In some examples, the controller is coupled to the PLL to generate the second clock signal. In certain implementations, a first digital frequency synthesis (DFS), coupled to the controller, uses a first set of clock phases to generate the first clock signal, where each of the first set of clock phases is one of the plurality of clock phases generated by the PLL. In some examples, a second DFS, also coupled to the controller, uses a second set of clock phases to generate the second clock signal, where each of the second set of clockphases is one of the plurality of clockphases generated by the PLL. In certain examples, the first set of clock phases or the second set of clock phases has a part of or all clock phases generated by the PLL. In some examples, the first set of clock phases include a first number of clock phases. In certain examples, the second set of clock phases include a second number of clock phases.

Initially, the controller (e.g., the controller 140 in FIG. 1) determines a phase relationship of the first clock signal and the second clock signal (310). The controller monitors one or more first clock edges of the first clock signal and one or more second clock edges of the second clock signal (315). The controller receives one or more heads-up cycle numbers (320) for respective read or write operations of memory devices (e.g., memory, data fabric, etc.) to the FIFO, which indicates the amount of overhead for conducting the read or write operation. Next, the controller generates and updates one or more counters for the clock domains (325). The controller generates and updates one counter for each clock domain, and the counter is associated with the number of clock phases used to construct the clock domain. Further, the controller generates or determines one or more offsets based on the phase relationship, the one or more first clock edges, and the one or more second clock edges (330). The controller generates and sends one or more heads-up signals associated with the one or more offsets to a respective memory device (335). Additionally, the controller generates one or more command signals based upon the heads-up signals and heads-up cycle numbers to the FIFO (340).

In some variations, the controller generates a first read heads-up signal for a read operation (i.e., read from FIFO) of a first memory device (e.g., a memory, a data fabric, etc.). In some examples, the controller generates a first read offset based at least in part upon a first read heads-up cycle associated with the read operation to the first memory device and generates the first read heads-up signal based at least in part upon the first read offset. In certain variations, the controller generates a first write heads-up signal for a write operation (i.e., write to FIFO) of the first memory device. In certain examples, the controller generates a first write offset based at least in part upon a first write heads-up cycle associated with the write operation of the first memory device, and the first write heads-up signal based at least in part upon the first write offset.

In some variations, the controller generates a second read heads-up signal for a read operation to a second memory device (e.g., a memory, a data fabric, etc.). In some examples, the controller generates a second read offset based at least in part upon a second read heads-up cycle associated with the read operation of the second memory device, and the second read heads-up signal based at least in part upon the second read offset. In certain variations, the controller generates a second write heads-up signal for a write operation of the second memory device. In certain examples, the controller generates a second write offset based at least in part upon a second write heads-up cycle associated with the write operation of the second memory device, and the second write heads-up signal based at least in part upon the second write offset.

In some examples, an offset is related to the phase number of clock phases used to construct the corresponding clock signal. In certain examples, an offset is proportional to the phase number of clock phases used to construct the corresponding clock signal. In some examples, the offset is proportional to the number of heads-up cycles required for a respective read/write operation. In one example, the offset is proportional to the number of heads-up cycles multiplied by the phase number of clock phases used to construct the corresponding clock signal.

In some implementations, the controller determines the one or more offsets and the counters during a clock gap. In certain implementations, the controller sends a heads-up signal to provide notice to the FIFO with a follow-up command signal to the FIFO to perform the read or write operation. In some variations, the FIFO performs the requested read or write operation to the corresponding memory device as requested.

Figure 4:
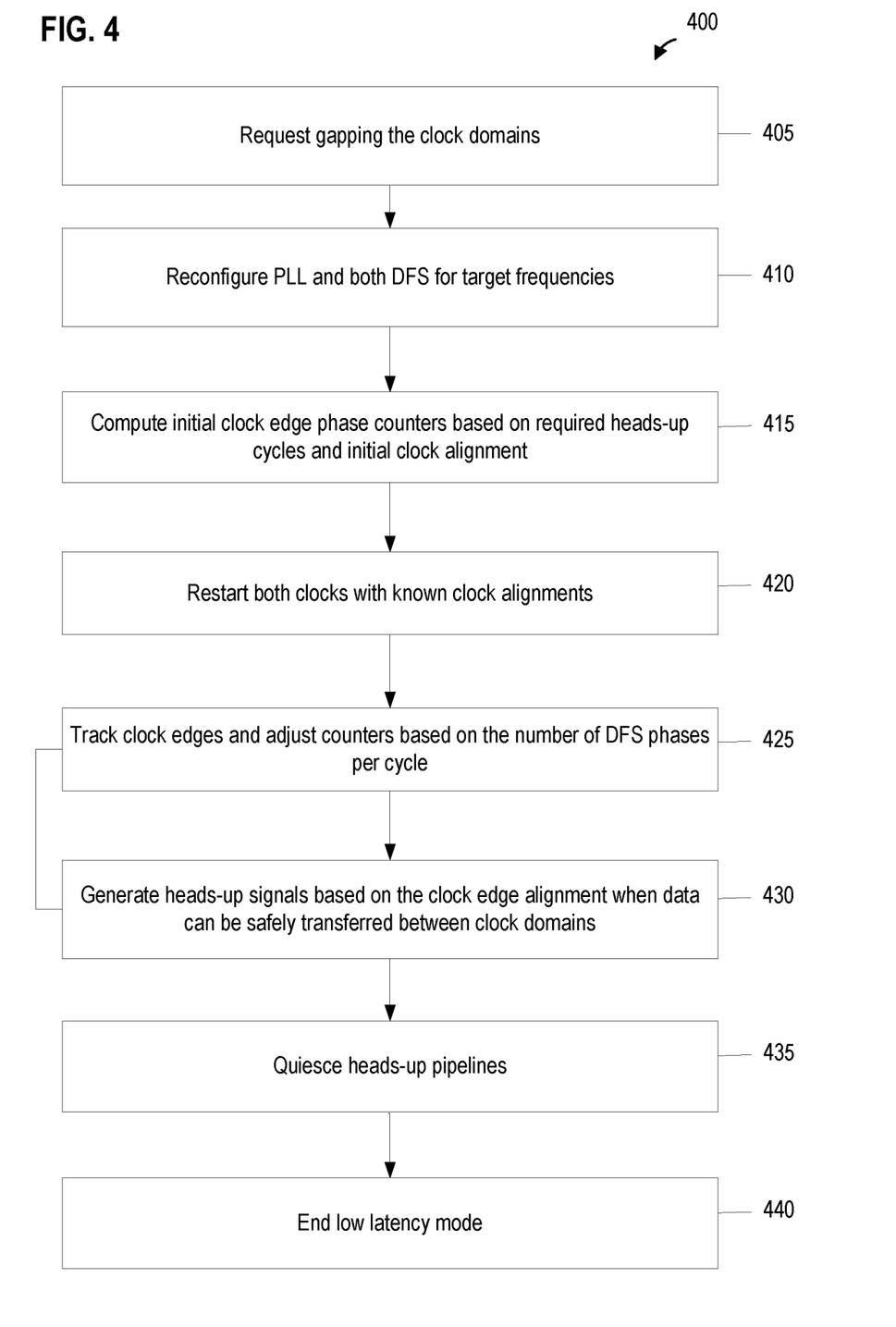
FIG. 4 is a flowchart illustrating one example of a method for synchronizing data transfers across two clock domains in accordance with one example set forth in the disclosure.

FIG. 4 is a flowchart illustrating one example of a method 400 for synchronizing data transfers across two clock domains in accordance with one example set forth in the disclosure. Aspects of embodiments of the method 400 are performed, for example, a controller (e.g., the controller 140 in FIG. 1). In some implementations, one or more steps of method 400 are optional and/or modified by one or more steps of other embodiments described herein. In some implementations, one or more steps of other embodiments described herein are added to the method 400. In certain implementations, the order of one or more steps of method 300 may be changed. First, the controller (e.g., an SMU) requests gapping the clock domains (405).

Next, the controller reconfigures the PLL (e.g., the PLL 105 in FIG. 1) and the two DFSes (e.g., the DFSes 112 and 116 in FIG. 1) for target frequencies (410). In some variations, the controller also configures other components in the clocking system, besides the PLL and DFSes. For example, one DFS is configured to provide a clock signal with a target frequency of 3.2 GHz and another DFS is configured to provide a clock signal with a target frequency of 1.6 GHz.

The controller computes initial clock edge phase counters based on the required heads-up cycles and initial clock alignment (415). In one example, the controller uses the target frequencies to determine initial counter values. In some variations, the counters (e.g., counters 214B and 224B in FIG. 2B) need to be offset a specific number of cycles. In some examples, the cycles are related to the frequency and the DFS phase count of the respective clock domain. In some implementations, the calculation are completed during a clock gap. In some examples, the controller determines and generates heads-up signals based on the frequencies and the heads-up cycles (e.g., 5 read cycles, 17 write cycles, etc.) In certain implementations, the counters are used track the clock signals.

Further, the controller coordinates the two DFSes to restart the two clock signals known clock alignments (420). In one example, the controller coordinates the two DFSes to restart the clock signals to have rising edges at the same time. In one example, the controller coordinates the two DFSes to restart the clock signals to have falling edges at the same time.

The controller track clock edges and adjust clock counters based on the number of DFS phases per cycle (425). In some variations, the counters are decremented related to the number of DFS phases per cycle for the respective clock domain. In certain variations, the controllers determines the timing of and/or generates one or more heads-up signals based on clock edge alignment when data can be safely transferred between clock domains (430). In some examples, the controller compares the counters for each respective clock domain and determines the time to perform a transfer of data between clock domains. In certain examples, to initiate a data transfer, the controller generates write/read heads-up signals (e.g., heads-up signals 216B and 226B in FIG. 2B). The write/read are then delay for the appropriate number of cycles (e.g., the rising edges of 218B and 228B in FIG. 2B). Steps 425 and 430 repeat for subsequent reads and writes. In some cases, the steps 425 and 430 repeat to ensure low latency.

The controller quiesce heads-up pipelines (435) and end the low latency mode (440). In some examples, to switch to a new frequency all traffic to the FIFO needs to complete before the clock domains can go into a gap state.

Although features and elements are described above in particular combinations, each feature or element can be used alone without the other features and elements or in various combinations with or without other features and elements. The apparatus described herein in some implementations are manufactured by using a computer program, software, or firmware incorporated in a non-transitory computer-readable storage medium for execution by a general-purpose computer or a processor. Examples of computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

In the preceding detailed description of the various embodiments, reference has been made to the accompanying drawings which form a part thereof, and in which is shown by way of illustration specific preferred embodiments in which the invention may be practiced. These embodiments are described in sufficient detail to enable those skilled in the art to practice the invention, and it is to be understood that other embodiments may be utilized, and that logical, mechanical and electrical changes may be made without departing from the scope of the invention. To avoid detail not necessary to enable those skilled in the art to practice the invention, the description may omit certain information known to those skilled in the art. Furthermore, many other varied embodiments that incorporate the teachings of the disclosure may be easily constructed by those skilled in the art. Accordingly, the present invention is not intended to be limited to the specific form set forth herein, but on the contrary, it is intended to cover such alternatives, modifications, and equivalents, as can be reasonably included within the scope of the invention. The preceding detailed description is, therefore, not to be taken in a limiting sense, and the scope of the present invention is defined only by the appended claims. The above detailed description of the embodiments and the examples described therein have been presented for the purposes of illustration and description only and not by limitation. For example, the operations described are done in any suitable order or manner. It is therefore contemplated that the present invention covers any and all modifications, variations or equivalents that fall within the scope of the basic underlying principles disclosed above and claimed herein.

The above detailed description and the examples described therein have been presented for the purposes of illustration and description only and not for limitation.

What is claimed is:

1. An integrated circuit comprising:
a first-in first-out buffer (FIFO);
a memory controller configured to operate in a first clock domain and coupled to the FIFO, the first clock domain associated with a first clock signal;
a data fabric configured to operate in a second clock domain and coupled to the FIFO, the second clock domain associated with a second clock signal, a second frequency of the second clock signal being different from a first frequency of the first clock signal; and
a controller coupled to the FIFO and configured to:
generate a first offset based on a phase relationship between the first clock signal and the second clock signal, the first clock signal, and the second clock signal; and
send a first heads-up signal, based upon the first offset, to the memory controller.

2. The integrated circuit of claim 1, wherein the controller is further configured to:
monitor one or more first clock edges of the first clock signal and one or more second clock edges of the second clock signal; and
generate the first offset based on the phase relationship, the one or more first clock edges, and the one or more second clock edges.

3. The integrated circuit of claim 1, wherein the controller is coupled to a phase-locked loop (PLL) to generate the first clock signal, wherein the PLL is configured to generate a plurality of clock phases, wherein the controller is coupled to the PLL to generate the second clock signal, wherein a first digital frequency synthesis (DFS) is configured to use a first set of clock phases to generate the first clock signal, wherein each of the first set of clock phases is one of the plurality of clock phases generated by the PLL, wherein a second DFS is configured to use a second set of clock phases to generate the second clock signal, wherein each of the second set of clock phases is one of the plurality of clock phases generated by the PLL.

4. The integrated circuit of claim 1, wherein the controller is further configured to:
receive a first heads-up cycle number associated with a memory coupled to the memory controller; and
send a first command signal based on the first heads-up signal and the first heads-up cycle number to the FIFO.

5. The integrated circuit of claim 1, wherein the controller is further configured to:
monitor a rising edge of one or more first clock edges for the first clock domain.

6. The integrated circuit of claim 3, wherein the controller is further configured to:
generate a first counter corresponding to the first offset;
wherein the first set of clock phases includes a first phase number of clock phases; wherein the first counter is associated with the first phase number.

7. The integrated circuit of claim 4, wherein the controller is further configured to:
receive a second heads-up cycle number associated with the memory;
wherein the first heads-up cycle number is associated with a memory write operation, and wherein the second heads-up cycle number is associated with a memory read operation.

8. The integrated circuit of claim 7, wherein the controller is further configured to:
receive a third heads-up cycle number associated with the data fabric and a fourth heads-up cycle number associated with the data fabric;
send a second heads-up signal based upon the phase relationship to the data fabric; and send a second command signal based on the second heads-up signal and the third heads-up cycle number to the FIFO;
wherein the third heads-up cycle number is associated with a data fabric write operation, and wherein the fourth heads-up cycle number is associated with a data fabric read operation.

9. A system comprising:
a first-in first-out buffer (FIFO);
a memory configured to operate in a first clock domain and coupled to the FIFO, the first clock domain associated with a first clock signal;
a data fabric configured to operate in a second clock domain and coupled to the FIFO, the second clock domain associated with a second clock signal, a second frequency of the second clock signal being different from a first frequency of the first clock signal; and
a controller coupled to the FIFO and configured to:
generate a first offset based on a phase relationship between the first clock signal and the second clock signal, the first clock signal, and the second clock signal; and
generate a first heads-up signal based upon the first offset to a memory controller coupled to the memory.

10. The system of claim 9, wherein the controller is further configured to:
monitor one or more first clock edges of the first clock signal and one or more second clock edges of the second clock signal; and
generate the first offset based on the phase relationship, the one or more first clock edges, and the one or more second clock edges.

11. The system of claim 9, wherein the controller is coupled to a phase-locked loop (PLL) to generate the first clock signal, wherein the PLL is configured to generate a plurality of clock phases, wherein the controller is coupled to the PLL to generate the second clock signal, wherein a first digital frequency synthesis (DFS) is configured to use a first set of clock phases to generate the first clock signal, wherein each of the first set of clock phases is one of the plurality of clock phases generated by the PLL, wherein a second DFS is configured to use a second set of clock phases to generate the second clock signal, wherein each of the second set of clock phases is one of the plurality of clock phases generated by the PLL.

12. The system of claim 11, wherein the controller is further configured to:
generate a first counter corresponding to the first offset;
wherein the first set of clock phases includes a first phase number of clock phases;
wherein the first counter is associated with the first phase number.

13. The system of claim 9, wherein the controller is further configured to:
receive a first heads-up cycle number associated with a memory coupled to the memory controller; and
send a first command signal based on the first heads-up signal and the first heads-up cycle number to the FIFO.

14. The system of claim 13, wherein the controller is further configured to:
receive a second heads-up cycle number associated with the memory;
wherein the first heads-up cycle number is associated with a memory write operation, and
wherein the second heads-up cycle number is associated with a memory read operation.

15. The system of claim 14, wherein the controller is further configured to:
receive a third heads-up cycle number associated with the data fabric and a fourth heads-up cycle number associated with the data fabric;
send a second heads-up signal based at least in part upon the phase relationship to the data fabric; and
send a second command signal based on the second heads-up signal and the third heads-up cycle number to the FIFO;
wherein the third heads-up cycle number is associated with a data fabric write operation, and wherein the fourth heads-up cycle number is associated with a data fabric read operation.

16. A method implemented by a controller, comprising:
receiving a first heads-up cycle number associated with an operation of a first memory device to a first-in first-out buffer (FIFO);
generating a first offset based on a phase relationship between a first clock signal and a second clock signal, a second frequency of the second clock signal being different from a first frequency of the first clock signal, and based on the first clock signal and the second clock signal;
sending a first heads-up signal based upon the first offset to the first memory device; and sending a first command signal based upon the first heads-up signal and the first heads-up cycle number to the FIFO.

17. The method of claim 16, further comprising:
generating the first clock signal using a first set of clock phases generated by a phase-locked loop (PLL); and
generating the second clock signal using a second set of clock phases generated by the PLL.

18. The method of claim 17, further comprising:
generating a first counter associated with the first clock signal,
wherein the first offset is associated with the first counter;
wherein the first set of clock phases includes a first phase number of clock phases; and
wherein the first counter is associated with the first phase number.

19. The method of claim 16, further comprising:
generating a second offset based at least in part upon the phase relationship; and
generating a second heads-up signal based upon the second offset.

20. The method of claim 19, wherein the first memory device is a memory, and wherein a data fabric operates based on the second clock signal.

* * * * *